(12) United States Patent
Chou et al.

(10) Patent No.: US 8,658,915 B2
(45) Date of Patent: Feb. 25, 2014

(54) TWO-WAY WIRING DEVICE

(75) Inventors: Ching-Ho Chou, Taipei (TW); Dwo Chen, Taipei (TW); Shang-Yu Li, Taipei (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 370 days.

(21) Appl. No.: 12/979,457

(22) Filed: Dec. 28, 2010

(65) Prior Publication Data

US 2011/0155455 A1    Jun. 30, 2011

(30) Foreign Application Priority Data

Dec. 29, 2009   (TW) ................................ 98145647 A (51) Int. Cl.
*H05K 5/00* (2006.01)
*H01R 13/502* (2006.01)

(52) U.S. Cl.
USPC ............................ 174/560; 174/520; 361/674

(58) Field of Classification Search
USPC .......................................... 174/560; 361/674
See application file for complete search history.

(56) References Cited

U.S. PATENT DOCUMENTS

| | | | | |
|---|---|---|---|---|
| 5,942,727 | A * | 8/1999 | Strange | 174/58 |
| 7,830,649 | B2 * | 11/2010 | Yang | 361/674 |
| 7,857,498 | B2 * | 12/2010 | Smith | 362/640 |

\* cited by examiner

*Primary Examiner* — William H Mayo, III
*Assistant Examiner* — Hiram E Gonzalez
(74) *Attorney, Agent, or Firm* — Gottlieb, Rackman & Reisman, P.C.

(57) ABSTRACT

The configurations of a two way wiring device are provided in the present invention. The proposed device includes a case having a first side, a second side opposite to the first side, a third side formed between the first side and the second side and an open bottom passing therethrough a first conducting wire, wherein the third side includes a first side segment, a second side segment and a middle segment located between the first and the second side segments, and a conducting wire guiding pathway formed on the case and the first conducting wire passing the pathway and wired out of the case through one of the first side segment and the second side segment.

15 Claims, 8 Drawing Sheets

TWO-WAY WIRING DEVICE

FIELD OF THE INVENTION

The present invention relates to a device for two-way wiring. More particularly, it relates to an electronic ballast for both lateral wiring and back wiring.

BACKGROUND OF THE INVENTION

Figure 4A:
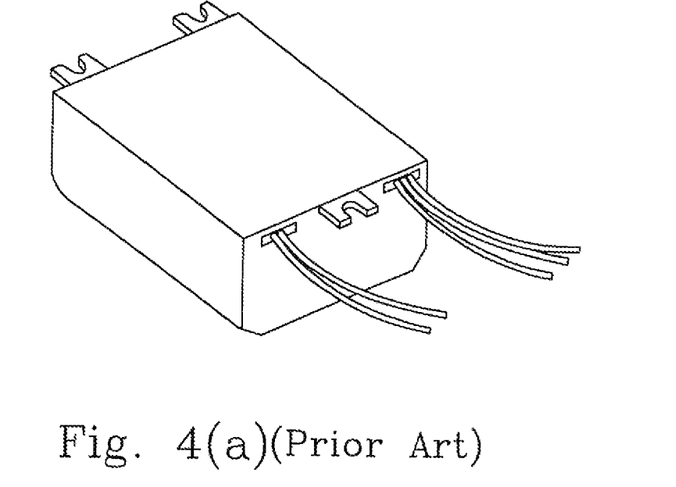
FIGS. 4(a) and 4(b) respectively show a schematic diagram of an electronic ballast for one-way lateral wiring and one-way back wiring in the prior art.
Figure 4B:
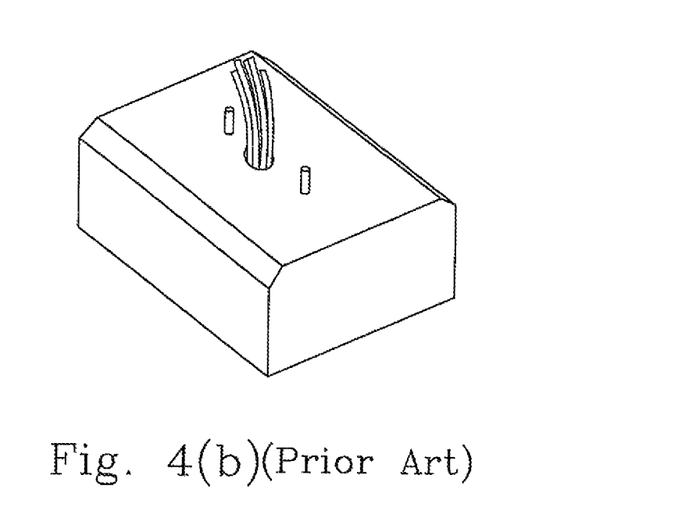

A lamp set comprises a light source, a lamp base, connecting lines and an electronic ballast. The various lamp set structures may possess requirements toward the wiring of the ballast different from each other. In general, there are two kinds of ballast wiring: a lateral wiring form (see FIG. 4(a)) and a back wiring form (see FIG. 4(b)). The manufacturers of the electronic ballasts have to provide these two kinds of products to the manufacturers of the lamp sets, and no commonalities between these two kinds of products resulting in the products inventory of the manufacturers on both sides increased.

Figure 1A:
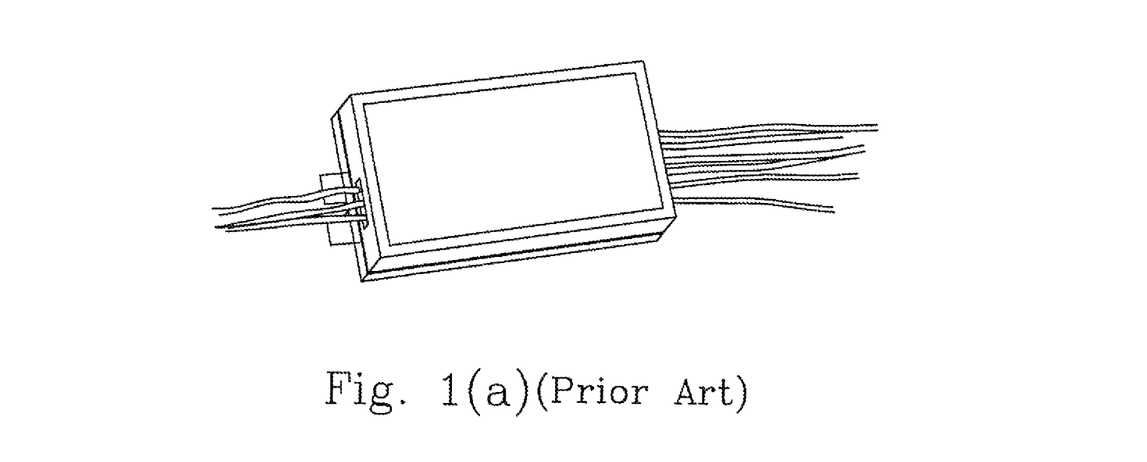
FIGS. 1(a) and 1(b) respectively show a schematic diagram of an electronic ballast adapting to the WAGO terminals for lateral wiring and back wiring in the prior art.
Figure 1B:
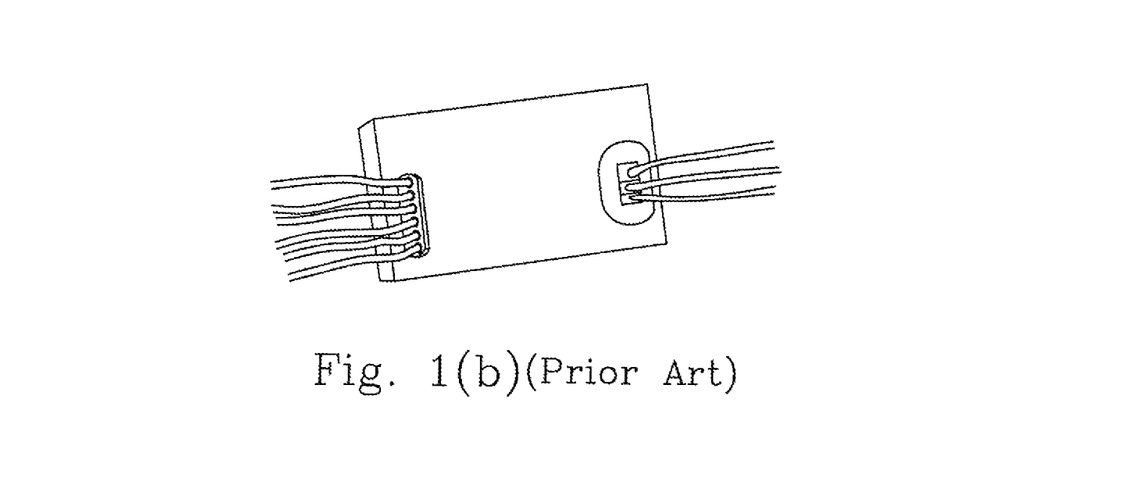
Figure 3A:
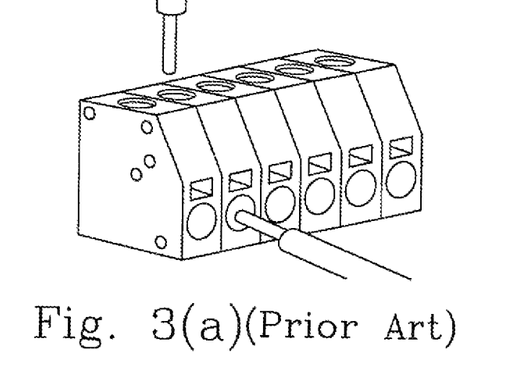
FIGS. 3(a) to 3(c) respectively show a schematic diagram of a WAGO terminal in the prior art.
Figure 3B:
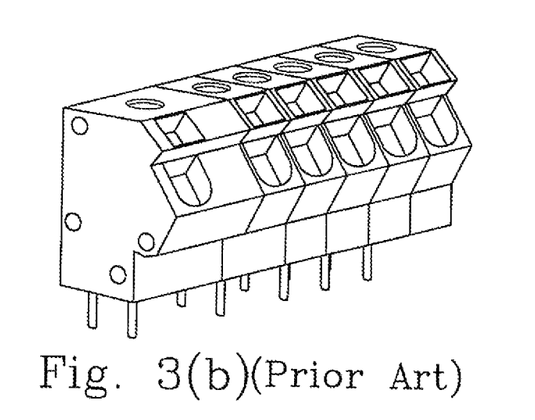
Figure 3C:
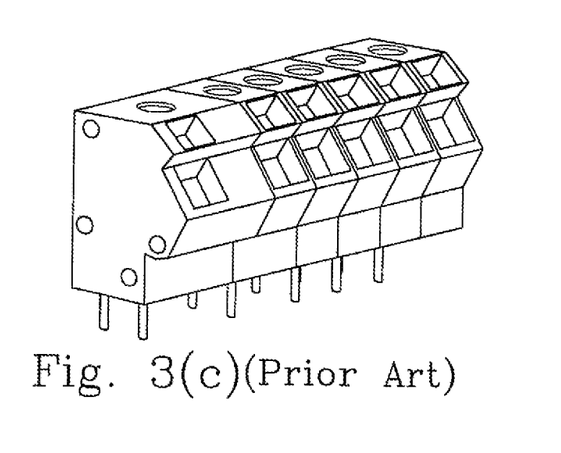

The supplier of WAGO terminals provides a new type of terminals having a type number of 253 (see FIGS. 3(a) to 3(c)), and the connecting lines of ballasts adapted to the WAGO 253 terminals could use two modes of straight downward insertion and lateral insertion when they are assembled with the lamp sets. The electronic ballasts adapted to the WAGO terminals are shown in FIGS. 1(a) and 1(b) respectively. The manufacturers of the electronic ballasts have to provide only one kind of products to the manufacturers of the lamp sets, and this kind of products could match with the requirements of the lateral wiring form and the back wiring form simultaneously, and this single kind of products could decrease the products inventory of the manufacturers on both sides. But the drawbacks of these WAGO terminals are that extra connecting lines are required to be connected to the electronic ballast and the lamp base such that the assembly difficulty and cost of the lamp sets manufacturers are increased.

Base on the above-mentioned considerations, the present invention is aimed at the development of a practical two-way wiring device to decrease the assembly difficulty and cost of the lamp sets.

Figure 2A:
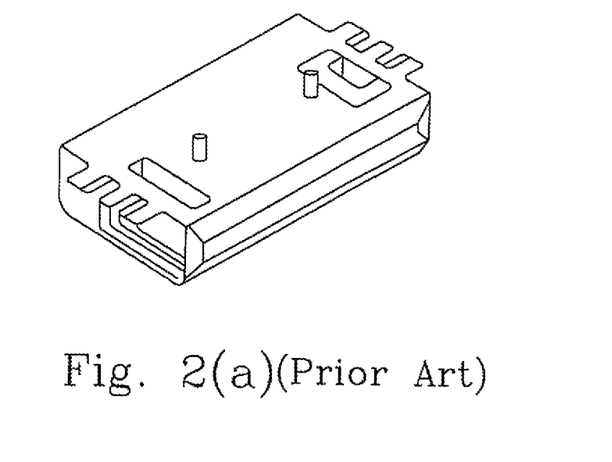
FIGS. 2(a) and 2(b) respectively show a schematic diagram of an electronic ballast with stud bolt and without stud bolt in the prior art.
Figure 2B:
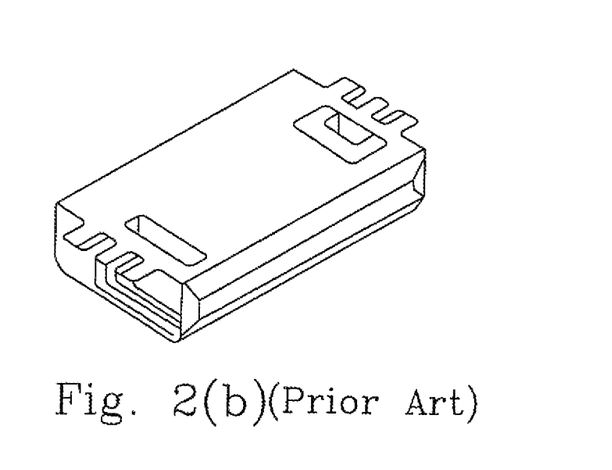
Figure 8:
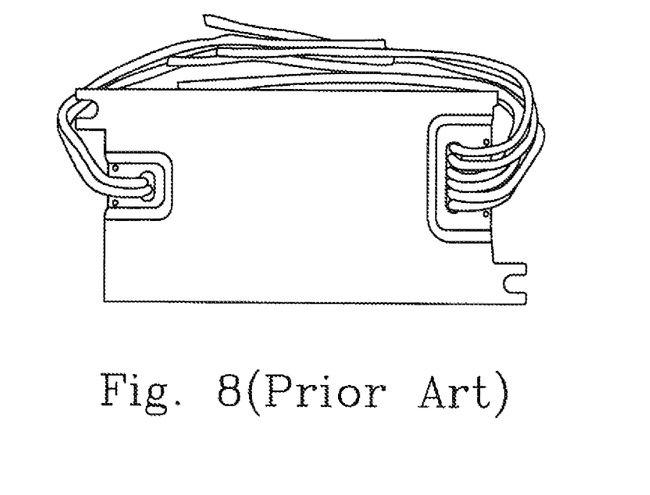
FIG. 8 shows a schematic diagram of an electronic ballast for a not good two-way wiring in the prior art.

FIG. 2 is a schematic diagram showing the exterior sizes of an electronic ballast, the length, the width and the latitude of which could be changed, but the product fixing holes and the wiring positions are industrial standards and should not be changed. FIG. 8 is a not good two-way wiring form, it changes the product fixing holes to facilitate the realization of the two-way wiring, the output lines are bent into 90 degrees so as to accomplish the lateral wiring function, but the whole row of output lines cover the reserved fixing holes of the lamp set and thus this lamp set has no compatibility with the standard lamp sets used in the industry.

Keeping the drawbacks of the prior arts in mind, and employing experiments and research full-heartily and persistently, the applicant finally conceived a two-way wiring device.

SUMMARY OF THE INVENTION

It is therefore an object of the present invention to provide an electronic ballast for both lateral wiring and back wiring, which indeed possesses the non-obviousness and the novelty.

According to the first aspect of the present invention, a two-way wiring device comprises a case having a first longitudinal side, a second longitudinal side opposite to the first longitudinal side, a first transverse side formed between the first longitudinal side and the second longitudinal side, and an open bottom passing therethrough a first output conducting wire, wherein the first transverse side includes a first side segment, a second side segment and a middle segment located between the first and the second side segments, and a conducting wire guiding pathway formed on the case and passing therethrough the first output conducting wire wired out of the case through one of the first side segment and the second side segment.

Preferably, the case further comprises a first surface, a second surface having a first outlet and a first fixing hole, the first fixing hole is set at an intersection of the first and the second surfaces and has a first set point for fixing the wiring device, the open bottom is a first line hole, is set on the first surface and has a second set point, the first output conducting wire is wired out of the case from one of the first surface and the first outlet after passing through the first line hole, the first output conducting wire interferes with the usage of the first fixing hole when the first output conducting wire is wired out of the case from the second set point along the first surface and toward the first set point, the first outlet is adjacent to one of the first and the second side segments of the first transverse side, and the conducting wire guiding pathway is a first conducting wire slot set on the first surface, adjacent to the first line hole, connected to the first outlet, containing and guiding the first output conducting wire after passing through the first line hole to be completely subsumed therein and wired out of the case from the first outlet, and without interfering the usage of the first fixing hole.

Preferably, the case further comprises a second transverse side formed between the first longitudinal side and the second longitudinal side, a third surface having a second outlet, a second fixing hole, a second line hole and a second conducting wire slot, the second transverse side includes a first side segment, a second side segment and a middle segment located between the first and the second side segments, the second fixing hole is set at an intersection of the first and the third surfaces and has a third set point for fixing the wiring device, the first and the second fixing holes are respectively located on a first and a second outward extension surfaces of the first surface, the second line hole is set on the first surface and has a fourth set point passing therethrough a second output conducting wire wired out of the case from one of the first surface and the second outlet after passing through the second line hole, the second output conducting wire interferes with the usage of the second fixing hole when the second output conducting wire is wired out of the case from the fourth set point along the first surface and toward the third set point, the second outlet is adjacent to one of the first and the second side segments of the second transverse side, and the second conducting wire slot is set on the first surface, is adjacent to the second line hole, is connected to the second outlet, contains and guides the second output conducting wire to be completely subsumed therein after passing through the second line hole and to be wired out of the case from the second outlet without interfering the usage of the second fixing hole.

Preferably, the first line hole is an input hole of power source, the second line hole is an input hole of lamp load, the first output conducting wire is an output line of power source, and the second output conducting wire is an output line of lamp load.

Preferably, the device further comprises a circuit board, the case further comprises an upper shell and a lower shell, the circuit board is electrically connected to the first and the second output conducting wires, the circuit board is configured on the lower shell and is contained between the upper and the lower shells, and the first, the second and the third surfaces, the first and the second conducting wire slots and the first and the second outlets are all deployed on the lower shell.

Preferably, the middle segment of the first transverse side has a length larger than one fifth of a length of the first transverse side and the middle segment of the second transverse side has a length larger than one fifth of a length of the second transverse side also, and the first to the fourth set points are four intersections between four axes passing through four centers of the first line hole, the first fixing hole, the second line hole and the second fixing hole, and the first surface, the first outward extension surface, the first surface and the second outward extension surface respectively.

Preferably, the device is configured in a florescent lamp system.

According to the second aspect of the present invention, a two-way wiring electronic ballast comprises a case having a first side, a second side opposite to the first side, a third side formed between the first side and the second side, and an open bottom passing therethrough a first output conducting wire, wherein the third side includes a first side segment, a second side segment and a middle segment located between the first and the second side segments, and a conducting wire guiding pathway formed on the case and passing therethrough the first output conducting wire wired out of the case through one of the first side segment and the second side segment.

Preferably, the first side is a first longitudinal side, the second side is a second longitudinal side, and the third side is a first transverse side.

Preferably, the case further comprises a first surface, a second surface having a first outlet and a first fixing hole, the first fixing hole is set at an intersection of the first and the second surfaces and has a first set point for fixing the wiring device, the open bottom is a first line hole, is set on the first surface and has a second set point, the first output conducting wire is wired out of the case from one of the first surface and the first outlet after passing through the first line hole, the first output conducting wire interferes with the usage of the first fixing hole when the first output conducting wire is wired out of the case from the second set point along the first surface and toward the first set point, the first outlet is adjacent to one of the first and the second side segments of the first transverse side, and the conducting wire guiding pathway is a first conducting wire slot set on the first surface, adjacent to the first line hole, connected to the first outlet, containing and guiding the first output conducting wire to be completely subsumed therein after passing through the first line hole and wired out of the case from the first outlet, and without interfering the usage of the first fixing hole.

Preferably, the case further comprises a second transverse side formed between the first longitudinal side and the second longitudinal side, a third surface having a second outlet, a second fixing hole, a second line hole and a second conducting wire slot, the second transverse side includes a first side segment, a second side segment and a middle segment located between the first and the second side segments, the second fixing hole is set at an intersection of the first and the third surfaces and has a third set point for fixing the wiring device, the first and the second fixing holes are respectively located on a first and a second outward extension surfaces of the first surface, the second line hole is set on the first surface and has a fourth set point passing therethrough a second output conducting wire wired out of the case from one of the first surface and the second outlet after passing through the second line hole, the second output conducting wire interferes with the usage of the second fixing hole when the second output conducting wire is wired out of the case from the fourth set point along the first surface and toward the third set point, the second outlet is adjacent to one of the first and the second side segments of the second transverse side, and the second conducting wire slot is set on the first surface, is adjacent to the second line hole, is connected to the second outlet, contains and guides the second output conducting wire to be completely subsumed therein after passing through the second line hole and to be wired out of the case from the second outlet without interfering the usage of the second fixing hole.

Preferably, the first line hole is an input hole of power source, the second line hole is an input hole of lamp load, the first output conducting wire is an output line of power source, and the second output conducting wire is an output line of lamp load.

Preferably, the electronic ballast further comprises a circuit board, the case further comprises a top shell and a base, the circuit board is electrically connected to the first and the second output conducting wires, the circuit board is configured on the base and is contained between the top shell and the base, and the first, the second and the third surfaces, the first and the second conducting wire slots and the first and the second outlets are all deployed on the base.

Preferably, the middle segment of the first transverse side has a length larger than one fifth of a length of the first transverse side, the middle segment of the second transverse side has a length larger than one fifth of a length of the second transverse side, and the first to the fourth set points are four intersections between four axes passing through four centers of the first line hole, the first fixing hole, the second line hole and the second fixing hole, and the first surface, the first outward extension surface, the first surface and the second outward extension surface respectively.

Preferably, the electronic ballast is configured in an illumination system.

The present invention may best be understood through the following descriptions with reference to the accompanying drawings, in which:

DETAILED DESCRIPTION OF THE PREFERRED EMBODIMENT

The characteristics of the proposed two-way wiring device are having both the back wiring and lateral wiring functions in accordance with the industry standard conditions of fixing holes of electronic ballast to accomplish the purposes of decrease the assembly difficulty and cost.

Figure 5:
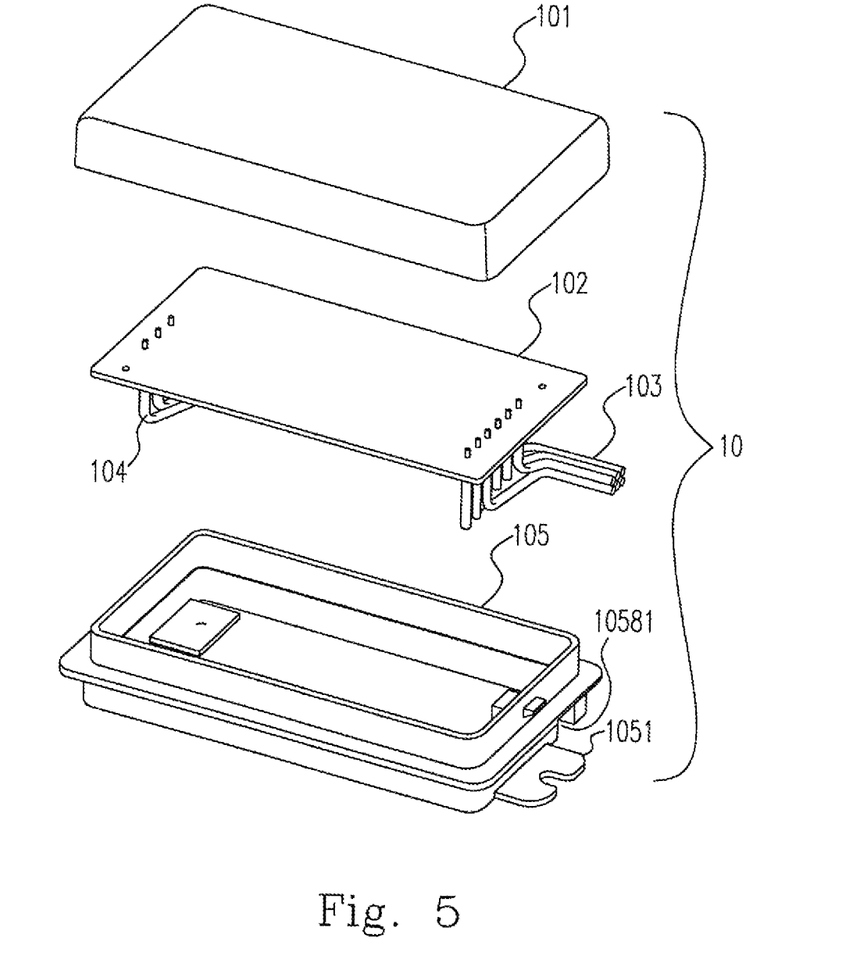
FIG. 5 shows an exploded diagram of an electronic ballast for two-way lateral wiring and back wiring according to the first preferred embodiment of the present invention.
Figure 6A:
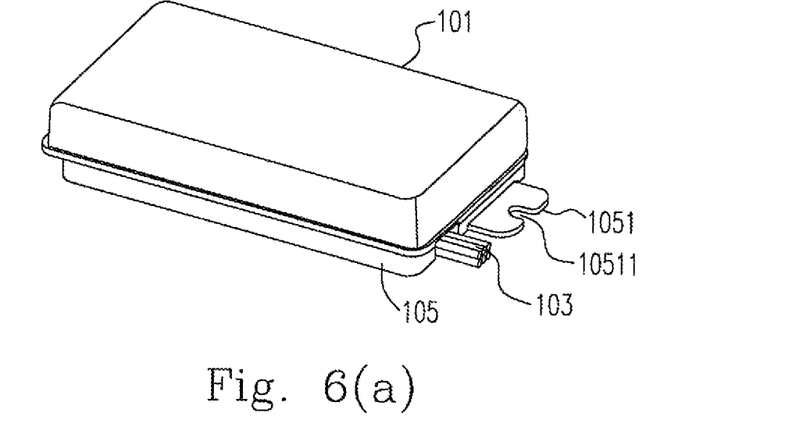
FIGS. 6(a) and 6(b) respectively show the bottom-view and the side-view diagrams of electronic ballast with lateral wiring according to the second preferred embodiment of the present invention.
Figure 6B:
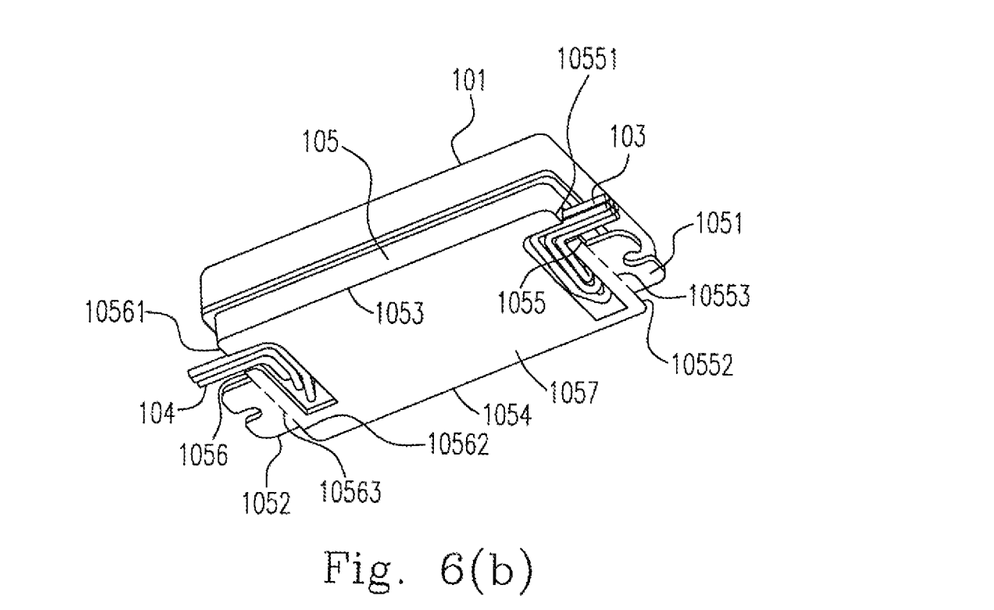
Figure 7A:
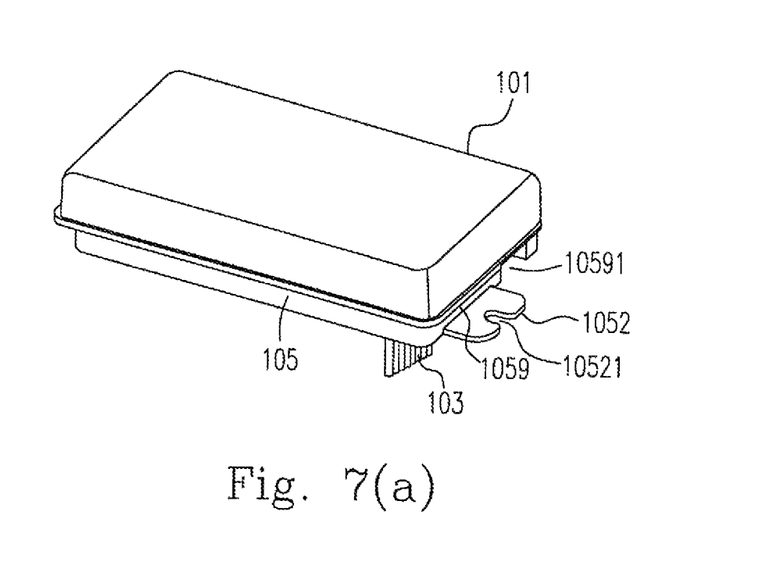
FIGS. 7(a) and 7(b) respectively show the bottom-view and the side-view diagrams of an electronic ballast with back wiring according to the third preferred embodiment of the present invention.
Figure 7B:
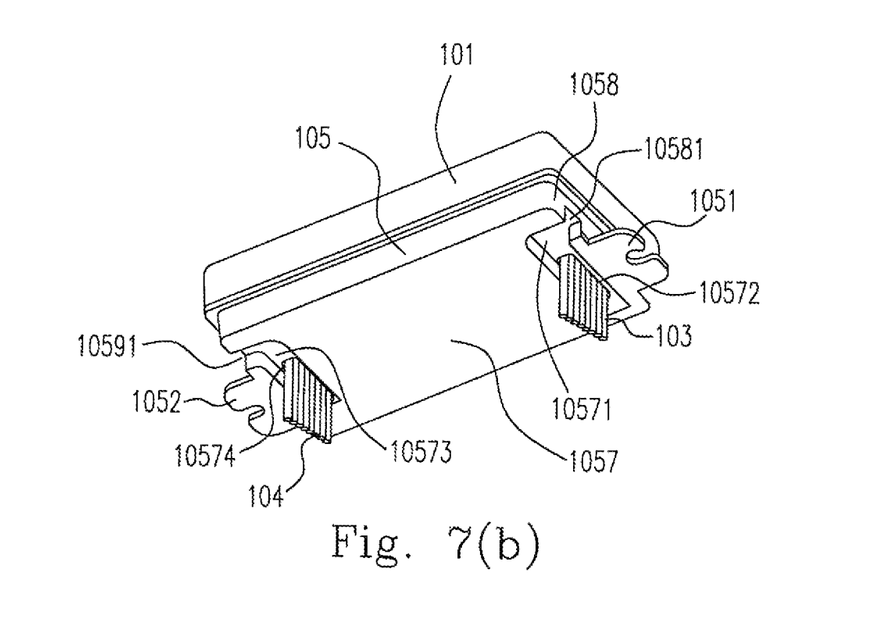

FIG. 5 is an exploded diagram of electronic ballast 10 for two-way lateral wiring and back wiring according to the first preferred embodiment of the present invention. It is the exploded diagram of the top shell (upper shell) 101, a circuit board 102, a first and a second output conducting wires 103/104 and a base (lower shell) 105, wherein the first and the second output conducting wires 103/104 are directly soldered with the circuit board 102, the base 105 further comprises a first outward extension surface 1051 and a first outlet 10581. FIGS. 6(a) and 6(b) respectively show the bottom-view and the side-view diagrams of electronic ballast with a structure of back wiring form converted to lateral wiring form according to the second preferred embodiment of the present invention, the output wire are bent to 90 degrees to go around the fixing hole and bent to 90 degrees again for lateral wiring around the fixing hole to be in accordance with the positions of the fixing holes and the output wires of the standard electronic ballast used by the industry. FIGS. 7(a) and 7(b) respectively show the bottom-view and the side-view diagrams of a structure of electronic ballast with back wiring according to the third preferred embodiment of the present invention, and the output wires 103/104 are wired out of the case directly from the two line holes of the back. The innovative design of the base 105 is a L shaped conducting wire slot, this conducting wire slot does not influence (interfere) the fixing hole, and facilitates the function of converting from the back wiring to the lateral wiring. Observing from FIGS. 6(a), 6(b), 7(a) and 7(b), the wiring device of the present invention comprises a case (including the top shell 101 and the base 105) having a first longitudinal side 1053, a second longitudinal side 1054 opposite to the first longitudinal side 1053, a first transverse side 1055 formed between the first longitudinal side 1053 and the second longitudinal side 1054, and an open bottom (it is a first line hole 10572, see FIG. 7(b), passing therethrough a first output conducting wire 103, wherein the first transverse side 1055 includes a first side segment 10551, a second side segment 10552 and a middle segment 10553 located between the first and the second side segments 10551 and 10552 (wherein the length of the middle segment 10553 is, e.g., one fifth of the first transverse side 1055), and a conducting wire guiding pathway (it is a first conducting wire slot 10571 as shown in FIG. 7(b)) formed on the case 105 and passing therethrough the first output conducting wire 103 wired out of the case through one of the first side segment 10551 and the second side segment 10552.

As shown in FIGS. 6(a), 6(b), 7(a) and 7(b), the base 105 further comprises a first surface 1057, a second surface 1058 having a first outlet 10581 and a first fixing hole 10511, the first fixing hole 10511 is set at an intersection of the first and the second surfaces 1057 and 1058 (the first fixing hole 10511 is located on the first outward extension surface 1051 of the first surface 1057) and has a first set point 10512 (see FIG. 9) for fixing the wiring device 10, the open bottom is a first line hole 10572, is set on the first surface 1057 and has a second set point 10575 (see FIG. 9), the first output conducting wire 103 is wired out of the case from one of the first surface 1057 and the first outlet 10581 after passing through the first line hole 10572, the first output conducting wire 103 interferes with the usage of the first fixing hole 10511 when the first output conducting wire 103 is wired out of the case from the second set point 10575, along the first surface 1057 and toward the first set point 10512, the first outlet 10581 is adjacent to one of the first and the second side segments 10551 and 10552 of the first transverse side 1055, the conducting wire guiding pathway is a first conducting wire slot 10571 set on the first surface 1057, adjacent to the first line hole 10572, connected to the first outlet 10581, containing and guiding the first output conducting wire 133 after passing through the first line hole 10572 to be completely subsumed therein 10571 and wired out of the case from the first outlet 10581 without interfering the usage of the first fixing hole 10511.

In FIGS. 6(a), 6(b), 7(a) and 7(b), the base 105 further comprises a second transverse side 1056 formed between the first longitudinal side 1053 and the second longitudinal side 1054, a third surface 1059 having a second outlet 10591, a second fixing hole 10521, a second line hole 10574 and a second conducting wire slot 10573, the second transverse side 1056 includes a first side segment 10561, a second side segment 10562 and a middle segment 10563 located between the first and the second side segments 10561 and 10562 (a length of the middle segment 10563 is, e.g., larger than one fifth of a length of the second transverse side 1056), the second fixing hole 10521 is set at an intersection of the first and the third surfaces 1057 and 1059 (the second fixing hole 10521 is located on a second outward extension surface 1052 of the first surface 1057) and has a third set point 10522 (see FIG. 9) for fixing the wiring device 10, the second line hole 10574 is set on the first surface 1057 and has a fourth set point 10576 (see FIG. 9) passing therethrough a second output conducting wire 104 wired out of the case from one of the first surface 1057 and the second outlet 10591 after passing through the second line hole 10574, the second output conducting wire 104 interferes with the usage of the second fixing hole 10521 when the second output conducting wire 104 is wired out of the case from the fourth set point 10576, along the first surface 1057 and toward the third set point 10522, the second outlet 10591 is adjacent to one of the first and the second side segments 10561 and 10562 of the second transverse side 1056, the second conducting wire slot 10573 is set on the first surface 1057, is adjacent to the second line hole 10574, is connected to the second outlet 10591, contains and guides the second output conducting wire 104 to be completely subsumed therein 10573 after passing through the second line hole 10574 and to be wired out of the case from the second outlet 10591 without interfering the usage of the second fixing hole 10521.

As aforementioned, FIG. 8 is a schematic diagram of an electronic ballast for a not good two-way wiring in the prior art, and the usage of the fixing hole will be interfered with lateral wiring.

Figure 9:
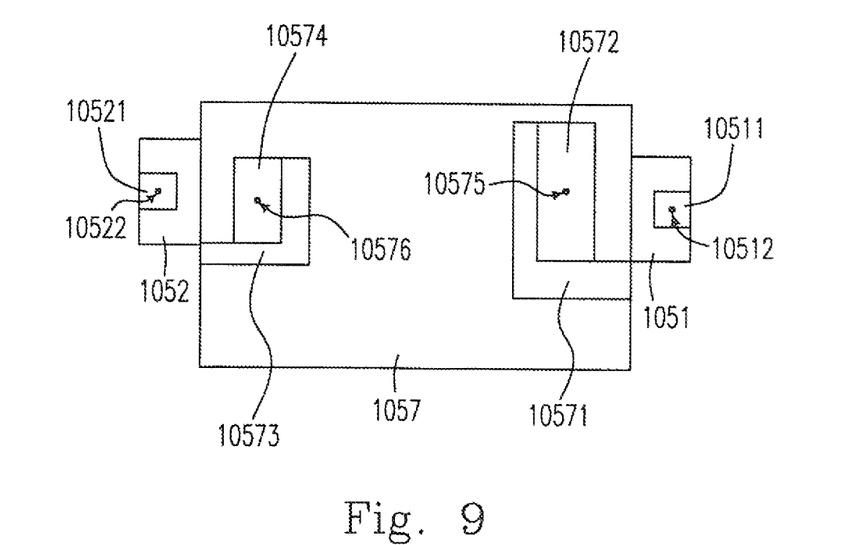
FIG. 9 shows the bottom-view diagram of an electronic ballast without any wiring according to the fourth preferred embodiment of the present invention.

FIG. 9 is the bottom-view diagram of an electronic ballast without any wiring according to the fourth preferred embodiment of the present invention. The first and the second fixing holes 10511 and 10512 are respectively located on the first and the second outward extension surfaces 1051 and 1052. The first to the fourth set points are shown (10512, 10575, 10522 and 10576 are four intersections between four axes passing through four centers of the first fixing hole 10511, the first line hole 10572, the second fixing hole 10521, and the second line hole 10574 and the first outward extension surface 1051, the first surface 1057, the second outward extension surface 1052 and the first surface 1057 respectively).

When compares FIG. 9 with FIGS. 6(*a*), 6(*b*), 7(*a*), 7(*b*) and 8, one could tell that the line holes of the present preferred embodiment 10572/10574 will not interfere the usages of the fixing holes 10511/10521 on both sides via the manipulation of the conducting wire slots 10571/10573. One skilled in the art would know, the first line hole 10572 on the right-hand side is an input hole of power source, the second line hole 10574 on the left-hand side is an input hole of lamp load, the first output conducting wire 103 on the right-hand side is an output line of power source, and the second output conducting wire 104 on the left-hand side is an output line of lamp load.

Experiments prove that the drawbacks in the prior art could be solved by the present invention, and the application conditions of the above-mentioned lamp sets are fulfilled.

According to the aforementioned descriptions, the present invention provides an electronic ballast for both lateral wiring and back wiring, which indeed possesses the non-obviousness and the novelty.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present invention which is defined by the appended claims.

What is claimed is:

1. A two-way wiring device, comprising:
a case having:
   a first longitudinal side;
   a second longitudinal side opposite to the first longitudinal side;
   a first transverse side formed between the first longitudinal side and the second longitudinal side;
   a second transverse side formed between the first longitudinal side and the second longitudinal side;
   a first surface;
   a second surface having a first outlet;
   an open bottom formed on the first surface and passing therethrough a first output conducting wire, wherein each of the first transverse side and the second transverse side includes a first side segment, a second side segment and a middle segment located between the first and the second side segments, and the first side segment, the middle segment and the second side segment of each transverse side are located on the same line;
   a first outward extension surface of the first surface extended from the middle segment of the first transverse side and having a first fixing hole extended from the middle segment of the first transverse side for fixing the wiring device; and
   a second outward extension surface of the first surface extended from the middle segment of the second transverse side and having a second fixing hole extending from the middle segment of the second transverse side for fixing the wiring device; and
   a conducting wire guiding pathway which avoids overlapping with the fixing holes and passing therethrough the first output conducting wire wired out of the case through one of the first surface and the first outlet, being a first conducting wire slot set on the first surface, connected to the first outlet, and containing and guiding the first output conducting wire after passing through the open bottom to be completely subsumed therein, wherein the first outlet is adjacent to one of the first side segment and the second side segment of the first transverse side.

2. A device according to claim 1, wherein the first surface intersects with the second surface to form the first transverse side, the first fixing hole has a first set point for fixing the wiring device, the open bottom is a first line hole, is set on the first surface and has a second set point, the first output conducting wire interferes with the usage of the first fixing hole when the first output conducting wire is wired out of the case from the second set point along the first surface and toward the first set point, and the conducting wire guiding pathway is adjacent to the first line hole, and without interfering the usage of the first fixing hole.

3. A device according to claim 2, wherein the case further comprises a third surface having a second outlet, a second line hole and a second conducting wire slot, the second fixing hole has a third set point for fixing the wiring device, the second line hole is set on the first surface and has a fourth set point passing therethrough a second output conducting wire wired out of the case from one of the first surface and the second outlet after passing through the second line hole, the second output conducting wire interferes with the usage of the second fixing hole when the second output conducting wire is wired out of the case from the fourth set point along the first surface and toward the third set point, the second outlet is adjacent to one of the first and the second side segments of the second transverse side, and the second conducting wire slot is set on the first surface, is adjacent to the second line hole, is connected to the second outlet, contains and guides the second output conducting wire to be completely subsumed therein after passing through the second line hole and to be wired out of the case from the second outlet without interfering the usage of the second fixing hole.

4. A device according to claim 3, wherein the first line hole is an input hole of power source, the second line hole is an input hole of a lamp load, the first output conducting wire is an output line of power source, and the second output conducting wire is an output line of the lamp load.

5. A device according to claim 3 further comprising a circuit board, wherein the case further comprises an upper shell and a lower shell, the circuit board is electrically connected to the first and the second output conducting wires, the circuit board is configured on the lower shell and is contained between the upper and the lower shells, and the first, the second and the third surfaces, the first and the second conducting wire slots and the first and the second outlets are all deployed on the lower shell.

6. A device according to claim 3, wherein the middle segment of the first transverse side has a length larger than one fifth of a length of the first transverse side and the middle segment of the second transverse side has a length larger than one fifth of a length of the second transverse side also, and the first to the fourth set points are four intersections respectively between a first axis passing through a first center of the first line hole and the first surface, a second axis passing through a second center of the first fixing hole and the first outward extension surface, a third axis passing through a third center of the second line hole and the first surface, and a fourth axis passing through a fourth center of the second fixing hole and the second outward extension surface.

7. A device according to claim 1 configured in a florescent lamp system.

8. A two-way wiring electronic ballast, comprising:
a case having:
- a first side;
- a second side opposite to the first side;
- a third side formed between the first side and the second side;
- a fourth side formed between the first side and the second side;
- a first surface;
- a second surface having a first outlet;
- an open bottom formed on the first surface and passing therethrough a first output conducting wire, wherein each of the third side and the fourth side includes a first side segment, a second side segment and a middle segment located between the first and the second side segments; and the first side segment, the middle segment and the second side segment of each said side are located on the same line;
- a first outward extension surface of the first surface extended from the middle segment of the first side and having a first fixing hole extending from the middle segment of the first side for fixing the wiring device; and
- a second outward extension surface of the first surface extended from the middle segment of the fourth side and having a second fixing hole extending from the middle segment of the fourth side for fixing the wiring device; and
- a conducting wire guiding pathway which avoids overlapping with the fixing holes and passing therethrough the first output conducting wire wired out of the case through one of the first surface and the first outlet, being a first conducting wire slot set on the first surface, connected to the first outlet, and containing and guiding the first output conducting wire after passing through the open bottom to be completely subsumed therein, wherein the first outlet is adjacent to one of the first side segment and the second side segment of the first side.

9. An electronic ballast according to claim 8, wherein the first side is a first longitudinal side, the second side is a second longitudinal side, the third side is a first transverse side and the fourth side is a second transverse side.

10. An electronic ballast according to claim 9, wherein the first surface intersects with the second surface to form the first transverse side, the first fixing hole has a first set point for fixing the wiring device, the open bottom is a first line hole, is set on the first surface and has a second set point, the first output conducting wire interferes with the usage of the first fixing hole when the first output conducting wire is wired out of the case from the second set point along the first surface and toward the first set point, the first outlet is adjacent to one of the first and the second side segments of the first transverse side, and the conducting wire guiding pathway is adjacent to the first line hole and without interfering the usage of the first fixing hole.

11. An electronic ballast according to claim 10, wherein the case further comprises a third surface having a second outlet, a second line hole and a second conducting wire slot, the second fixing hole has a third set point for fixing the wiring device, the second line hole is set on the first surface and has a fourth set point passing therethrough a second output conducting wire wired out of the case from one of the first surface and the second outlet after passing through the second line hole, the second output conducting wire interferes with the usage of the second fixing hole when the second output conducting wire is wired out of the case from the fourth set point along the first surface and toward the third set point, the second outlet is adjacent to one of the first and the second side segments of the second transverse side, and the second conducting wire slot is set on the first surface, is adjacent to the second line hole, is connected to the second outlet, contains and guides the second output conducting wire to be completely subsumed therein after passing through the second line hole and to be wired out of the case from the second outlet without interfering the usage of the second fixing hole.

12. An electronic ballast according to claim 11, wherein the first line hole is an input hole of power source, the second line hole is an input hole of lamp load, the first output conducting wire is an output line of power source, and the second output conducting wire is an output line of a lamp load.

13. An electronic ballast according to claim 11 further comprising a circuit board, wherein the case further comprises a top shell and a base, the circuit board is electrically connected to the first and the second output conducting wires, the circuit board is configured on the base and is contained between the top shell and the base, and the first, the second and the third surfaces, the first and the second conducting wire slots and the first and the second outlets are all deployed on the base.

14. An electronic ballast according to claim 11, wherein the middle segment of the first transverse side has a length larger than one fifth of a length of the first transverse side, the middle segment of the second transverse side has a length larger than one fifth of a length of the second transverse side, and the first to the fourth set points are four intersections respectively between a first axis passing through a first center of the first line hole and the first surface, a second axis passing through a second center of the first fixing hole and the first outward extension surface, a third axis passing through a third center of the second line hole and the first surface, and a fourth axis passing through a fourth center of the second fixing hole and the second outward extension surface.

15. An electronic ballast according to claim 8 configured in an illumination system.

* * * * *